(12) United States Patent
Ishida

(10) Patent No.: US 10,504,955 B2
(45) Date of Patent: Dec. 10, 2019

(54) IMAGE-CAPTURING UNIT

(71) Applicant: NIKON CORPORATION, Tokyo (JP)

(72) Inventor: Tomohisa Ishida, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/237,307

(22) Filed: Dec. 31, 2018

(65) Prior Publication Data
US 2019/0140013 A1    May 9, 2019

Related U.S. Application Data

(63) Continuation of application No. 15/651,708, filed on Jul. 17, 2017, now Pat. No. 10,199,420, which is a (Continued)

(30) Foreign Application Priority Data

Jul. 20, 2012 (JP) .................................. 2012-161365

(51) Int. Cl.
*H01L 27/146* (2006.01)
*H04N 5/378* (2011.01)
*H04N 5/374* (2011.01)

(52) U.S. Cl.
CPC .. *H01L 27/14636* (2013.01); *H01L 27/14618* (2013.01); *H04N 5/374* (2013.01); *H04N 5/378* (2013.01); *H01L 2224/16* (2013.01)

(58) Field of Classification Search
CPC ......... H01L 27/14636; H01L 27/14618; H01L 2224/16; H04N 5/378; H04N 5/374
(Continued)

(56) References Cited

U.S. PATENT DOCUMENTS 4,523,102 A * 6/1985 Kazufumi ............. G03F 7/0007
156/273.5
7,167,376 B2    1/2007 Miyashita et al.
(Continued)

FOREIGN PATENT DOCUMENTS

CN    102379039 A    3/2012
EP    2 230 691 A2    9/2010
(Continued)

OTHER PUBLICATIONS

Sep. 3, 2013 International Search Report issued in International Application No. PCT/JP2013/004420.
(Continued)

*Primary Examiner* — Seung C Sohn
(74) *Attorney, Agent, or Firm* — Oliff PLC

(57) ABSTRACT

Provided is an image-capturing unit including an image-capturing chip that includes a first surface having a pixel and a second surface that is on an opposite side of the first surface and has provided thereon an output section that outputs a pixel signal read from the pixel; a transparent substrate that is arranged facing the first surface and includes a wire pattern; a mounting substrate that is arranged facing the second surface and supports the image-capturing chip; and a relay section that is arranged on the mounting substrate and relays, to the wire pattern, the pixel signal output from the output section. Also provided is an image-capturing apparatus including the image-capturing unit described above.

11 Claims, 5 Drawing Sheets

Related U.S. Application Data continuation of application No. 14/600,551, filed on Jan. 20, 2015, now Pat. No. 9,721,986, which is a continuation of application No. PCT/JP2013/004420, filed on Jul. 19, 2013.

(58) Field of Classification Search
    USPC .................................................... 250/208.1
    See application file for complete search history.

(56) References Cited

U.S. PATENT DOCUMENTS

| | | | |
|---|---|---|---|
| 7,304,684 B2 | 12/2007 | Segawa et al. | |
| 7,884,875 B2 | 2/2011 | Kwon et al. | |
| 8,283,755 B2 * | 10/2012 | Hayasaka | H01L 21/76898 |
| | | | 257/621 |
| 9,029,968 B2 | 5/2015 | Tsukagoshi et al. | |
| 9,046,678 B2 | 6/2015 | Kasuga | |
| 9,058,971 B2 | 6/2015 | Shih et al. | |
| 9,136,289 B2 | 9/2015 | Tam | |
| 2009/0122176 A1 | 5/2009 | Wu et al. | |
| 2009/0122178 A1 | 5/2009 | Kwon et al. | |
| 2009/0322929 A1 | 12/2009 | Webster | |
| 2011/0043686 A1 | 2/2011 | Chang | |
| 2011/0108940 A1 | 5/2011 | Huang et al. | |
| 2012/0104524 A1 | 5/2012 | Takeshita et al. | |

FOREIGN PATENT DOCUMENTS

| | | |
|---|---|---|
| JP | 2006-333131 A | 12/2006 |
| JP | 2007-049369 A | 2/2007 |
| JP | 2009-049290 A | 3/2009 |
| JP | 2009-246152 A | 10/2009 |
| JP | 2012-049383 A | 3/2012 |

OTHER PUBLICATIONS

Jan. 20, 2015 International Preliminary Report on Patentability issued in International Patent Application No. PCT/JP2013/004420.
Feb. 10, 2016 Extended Search Report issued in European Patent Application No. 13 81 9395.8.
Oct. 7, 2016 Office Action Issued in U.S. Appl. No. 14/600,551.
Sep. 13, 2016 Office Action issued in Japanese Patent Application No. 2014-525757.
Nov. 30, 2016 Office Action issued in Chinese Patent Application No. 201380045985.3.
Jun. 21, 2019 Office Action issued in European Patent Application No. 13 819 395.8.
Sep. 12, 2019 Office Action issued in Indian Patent Application No. 1403/DELNP/2015.

* cited by examiner

IMAGE-CAPTURING UNIT

This application is a Continuation of U.S. patent application Ser. No. 15/651,708, filed Jul. 17, 2017, which is a Continuation of U.S. patent application Ser. No. 14/600,551 filed Jan. 20, 2015, which is a continuation of PCT/JP2013/004420 filed Jul. 19, 2013, which in turn claims priority from Japanese Patent Application 2012-161365 filed Jul. 20, 2012. The disclosures of each of these applications are incorporated herein by reference in their entirety.

BACKGROUND

1. Technical Field

The present invention relates to an image-capturing unit, an image-capturing apparatus, and an image-capturing unit manufacturing method.

2. Related Art

An image-capturing unit is known that has a COG (Chip On Glass) structure. The COG image-capturing unit is directly connected to a transparent substrate and an image-capturing chip, using a flip-chip implementation technique. Patent Document 1: Japanese Patent Application Publication No. 2009-246152

With the flip-chip implementation, when the transparent substrate and the image-capturing chip are heated or cooled, warping occurs in the image-capturing chip. As a result, this warping causes stress in the bumps of the image-capturing chip, and there is a concern that the bumps would be damaged.

SUMMARY

According to a first aspect of the present invention, provided is an image-capturing unit comprising an image-capturing chip that includes a first surface having a pixel and a second surface that is on an opposite side of the first surface and has provided thereon an output section that outputs a pixel signal read from the pixel; a transparent substrate that is arranged facing the first surface and includes a wire pattern; a mounting substrate that is arranged facing the second surface and supports the image-capturing chip; and a relay section that is arranged on the mounting substrate and relays, to the wire pattern, the pixel signal output from the output section.

According to a second aspect of the present invention, provided is an image-capturing unit comprising an image-capturing chip that has a light receiving surface and a mounting surface that is on an opposite side of the light receiving surface; a mounting substrate that is arranged facing the mounting surface of the image-capturing chip and includes a wire pattern that is connected to the image-capturing chip; a transparent substrate that is arranged facing the light receiving surface of the image-capturing chip; and a connecting section that connects the transparent substrate and the wire pattern of the mounting substrate.

According to a third aspect of the present invention, provided is an image-capturing apparatus comprising the image-capturing unit described above.

According to a fourth aspect of the present invention, provided is an image-capturing unit manufacturing apparatus comprising forming, on a second surface of a wafer, an output section that is electrically connected to a pixel formed on the wafer and used for outputting a pixel signal that is an output of the pixel; arranging a mounting substrate facing the second surface; forming a first surface that inputs incident light to the pixel, by grinding a surface of the wafer that is on an opposite side of the second surface; separating, into individual chip units, the wafer and the mounting substrate; and arranging a transparent substrate, which has a wire pattern provided thereon in a peripheral region that is outside of a region corresponding to the pixel, in a manner to face the first surface and cover the pixel, and connecting the wire pattern and the output section with a relay section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
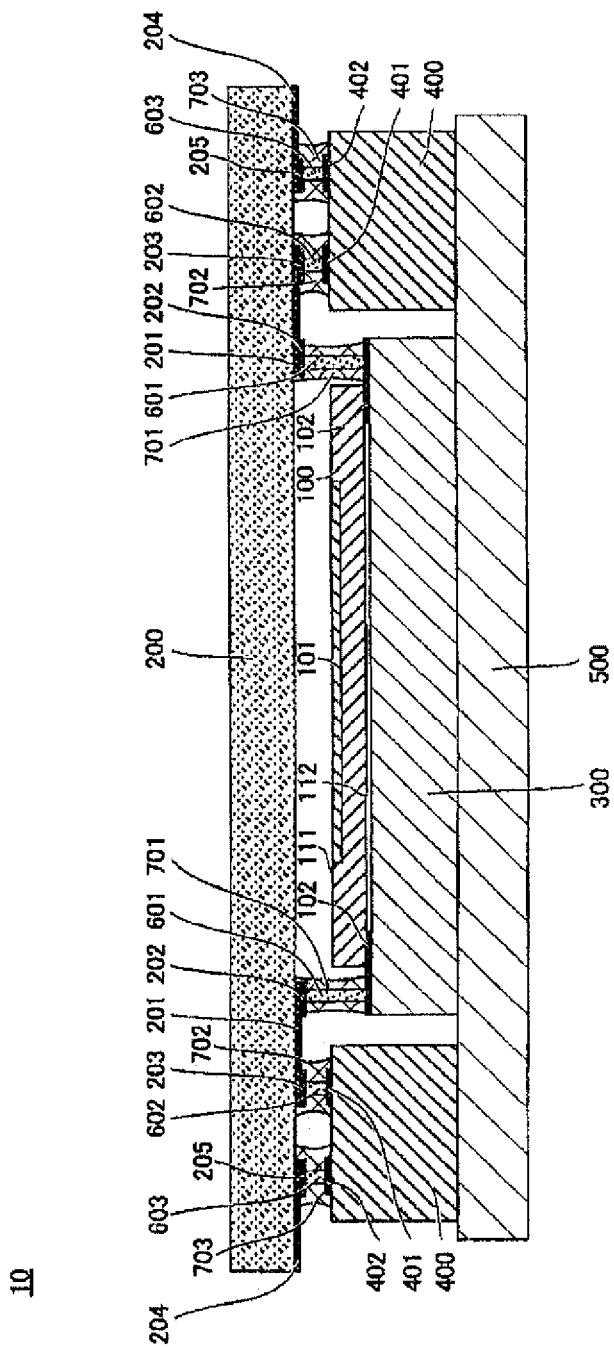
FIG. 1 shows a configuration of an image-capturing unit according to an embodiment of the present invention.

FIG. 1 shows a configuration of an image-capturing unit 10 according to an embodiment of the present invention. The image-capturing unit 10 is an image-capturing unit having a COG (Chip On Glass) structure. The image-capturing unit 10 includes an image-capturing chip 100, a transparent substrate 200, a mounting substrate 300, a signal processing chip 400, and a heat releasing member 500.

The image-capturing chip 100 is a backside illumination MOS image sensor. The image-capturing chip 100 includes a pixel region 101 on a first surface 111 side, which is the light receiving surface side. The pixel region 101 includes a plurality of pixels that perform photoelectric conversion on incident light. An output terminal 102, which is an output section for outputting a pixel signal that has been read from the pixels, is arranged on a second surface 112, which is the mounting surface and on the opposite side of the first surface 111. The output terminal 102 is arranged extending outward at the ends of the second surface 112. The image-capturing chip 100 includes a column circuit that has an initial stage amplifier in a region outside of the pixel region 101.

The transparent substrate 200 is a cover glass that is formed by borosilicate glass, quartz glass, non-alkali glass, or heat-resistant glass, for example. The transparent substrate 200 is arranged facing the first surface 111 of the image-capturing chip 100, and covers the pixel region 101. The transparent substrate 200 includes a first wire pattern 201, which relays the pixel signal to the signal processing chip 400, on the surface region thereof facing the image-capturing chip 100.

The electrode pad 202 provided on the first wire pattern 201 is electrically connected to the output terminal 102 of the image-capturing chip 100, via a first bump 601. In the present embodiment, the first bump 601 functions as at least a portion of a relay section that relays the pixel signal output from the output terminal 102 to the first wire pattern 201. The connecting section between the electrode pad 202 and the output terminal 102 is attached by an adhesive agent 701 formed to surround this connecting section. The adhesive agent 701 is also formed to surround the periphery of the image-capturing chip 100. In this way, the space between the pixel region 101 and the transparent substrate 200 is sealed. In other words, the adhesive agent 701 functions as a sealing member. Furthermore, the transparent substrate 200 includes a second wire pattern 204 that relays the pixel signal to the outside.

The mounting substrate 300 is arranged facing the second surface 112 of the image-capturing chip 100, and supports the image-capturing chip 100. Accordingly, the mounting substrate 300 serves as a support substrate. The linear expansion coefficient of the mounting substrate 300 is less than the linear expansion coefficient of the transparent substrate 200. Furthermore, the difference between the linear expansion coefficient of the mounting substrate 300 and the linear expansion coefficient of the transparent substrate 200 may be less than the difference between the linear expansion coefficient of the image-capturing chip 100 and the linear expansion coefficient of the transparent substrate 200.

A wire pattern may be formed on the mounting substrate 300. If a wire pattern is formed on the mounting substrate 300, the pixel signal output from the output terminal 102 is transmitted to the first wire pattern 201 of the transparent substrate 200 through the wire pattern of the mounting substrate 300. In this case, the first bump 601 can be treated as the connecting section that connects the wire pattern of the mounting substrate 300 to the transparent substrate 200.

In the image-capturing unit 10 of the present embodiment, the image-capturing chip 100 and the transparent substrate 200 are not directly bump-bonded to each other, and the mounting substrate 300 having a linear expansion coefficient between the linear expansion coefficients of the image-capturing chip 100 and the transparent substrate 200 is interposed between the image-capturing chip 100 and the transparent substrate 200. By interposing the mounting substrate 300 between the image-capturing chip 100 and the transparent substrate 200, the difference between the linear expansion coefficients of the transparent substrate 200 and the mounting substrate 300 can be made small relative to the difference between the linear expansion coefficients of the image-capturing chip 100 and the transparent substrate 200. Accordingly, the stress placed on the first bump 601 can be decreased.

Since the image-capturing chip 100 is a backside illumination MOS image sensor, the back surface of the image-capturing chip undergoes grinding during manufacturing. On the other hand, there are cases where the signal processing chip 400 does not undergo grinding during manufacturing. Accordingly, the image-capturing chip 100 and the signal processing chip 400 have different thicknesses. Therefore, in order to arrange the heat releasing member in a manner to contact both the image-capturing chip 100 and the signal processing chip 400, it is necessary to perform step machining on the heat releasing member according to the difference in thickness between the image-capturing chip 100 and the signal processing chip 400.

In the image-capturing unit 10 of the present embodiment, the mounting substrate 300 is arranged facing the second surface 112 of the image-capturing chip 100. The thickness of this mounting substrate 300 is adjusted according to the difference in thickness between the signal processing chip 400 and the image-capturing chip 100. Accordingly, by arranging the mounting substrate 300 on the second surface 112 side of the image-capturing chip 100, the mounting substrate 300 and the signal processing chip 400 can be arranged in the same plane on the heat releasing member 500.

A heat conducting material may be applied between the image-capturing chip 100 and the mounting substrate 300. The heat conducting material can be resin with greater thermal conductivity than air. In this way, the heat generated by the column circuit of the image-capturing chip 100 can be efficiently released to the mounting substrate 300 side. The heat conducting material may fill the entire region between the image-capturing chip 100 and the mounting substrate 300. In this case, the contact surface area between the heat conducting material and the mounting substrate 300 increases, and therefore the thermal resistance can be reduced. Accordingly, the heat releasing effect can be further improved.

The signal processing chip 400 includes a processing circuit that processes the pixel signal input through the first wire pattern 201. The number of signal processing chips is determined as needed according to the method used to read the pixel signal. In the present embodiment, 2-channel reading is adopted as the pixel signal reading method. Accordingly, there are two signal processing chips.

The signal processing chips 400 are arranged in parallel with the image-capturing chip 100. More specifically, the signal processing chips 400 are arranged in a peripheral region of the transparent substrate 200, which is outside the region covered by the pixel region 101. The signal processing chips 400 are arranged at a position distanced from the image-capturing chip 100, with the second bump 602, the transparent substrate 200, and the first bump 601 interposed therebetween. Accordingly, the heat generated by the signal processing chip 400 is transferred from the second bump 602 to the transparent substrate 200 and then from the transparent substrate 200 to the first bump 601, and then reaches the image-capturing chip 100. Compared to a case in which the image-capturing chip and the signal processing chips are layered, the heat transfer path from the signal processing chips 400 to the image-capturing chip 100 is longer, and therefore the heat transferred from the signal processing chips 400 to the image-capturing chip 100 can be reduced. Accordingly, the temperature increase of the pixel region caused by the heat from the signal processing chips 400 can be restricted, thereby enabling a decrease in the dark current. As a result, a decrease in image quality can be prevented.

Each signal processing chip 400 includes an electrode pad 401 and an electrode pad 402. The electrode pad 401 is electrically connected to the electrode pad 203 of the first wire pattern 201, via the second bump 602. The connecting section between the electrode pad 401 and the electrode pad 203 is attached by the adhesive agent 702 formed to surround this connecting section. The electrode pad 402 is electrically connected to the electrode pad 205 of the second wire pattern 204, via the third bump 603. The connecting section between the electrode pad 402 and the electrode pad 205 is attached by the adhesive agent 703 formed to surround this connecting section.

Furthermore, the second wire pattern 204 is electrically connected to a flexible substrate, which is not shown, and transmits to the outside via the flexible substrate. With the configuration described above, the pixel signal of the pixel region is output to the output terminal 102 from the non-incident surface side of the image-capturing chip 100, then transmitted to the incident surface side by the first bump 601, and then transmitted to the outside through the transparent substrate 200 and the signal processing chip 400.

The heat releasing member 500 is formed by a material with high thermal conductivity, such as metal, for example. The metal used can be copper, a nickel alloy, iron, aluminum, or the like. The heat releasing member 500 is arranged in contact with the surface of the mounting substrate 300 that is on the opposite side of the surface facing the image-capturing chip 100. The heat releasing member 500 also contacts the surface of the signal processing chip 400 that is on the opposite side of the surface to which the first wire pattern 201 is connected. Since the heat releasing member 500 contacts both the image-capturing chip 100 and the signal processing chip 400, both the heat generated by the image-capturing chip 100 and the heat generated by the signal processing chip 400 can be released. The heat releasing member 500 may be formed with a fin shape. In this way, the heat releasing surface area of the heat releasing member 500 increases, and therefore the heat releasing characteristic can be further improved.

The height of the first bump 601 is greater than the height of the second bump 602 and the third bump 603, by the thickness of the image-capturing chip 100. The present embodiment describes an example in which the thickness of the mounting substrate 300 is adjusted according to the difference in thickness between the signal processing chip 400 and the image-capturing chip 100, but when considering the relationship between the first bump 601 and the second bump, it can also be said that the thickness of the mounting substrate 300 is adjusted according to the difference between the thickness of the first bump 601 and the combined thickness of the signal processing chip 400 and the second bump 602. In other words, the thickness of the mounting substrate 300 is adjusted such that the sum of the thickness of the signal processing chip 400 and the thickness of the second bump 602 is equal to the sum of the thickness of the mounting substrate 300 and the thickness of the first bump 601. By adjusting the thickness of the mounting substrate 300 in this way, the image-capturing chip 100 and the signal processing chip 400 can be arranged in the same plane on the heat releasing member 500. Accordingly, there is no need to perform step machining on the heat releasing member 500. The heat releasing member 500 is attached to the body of an image-capturing apparatus, which is described further below.

In a case where a backside illumination MOS image sensor is used as the image-capturing chip, if a configuration is adopted in which the signal processing chip is layered on the second surface side of the image-capturing chip, a TSV (Through-Silicon Via) for transmitting the pixel signal to the signal processing chip is formed on the image-capturing chip. In this case, the width of the image-capturing chip is increased by the width of the TSV formed.

In the image-capturing unit 10 of the present embodiment, the output terminal 102 extends to the outside and the output terminal 102 of the image-capturing chip 100 and the first wire pattern of the signal processing chip 400 are electrically connected via the transparent substrate 200. Since there is no TSV formed in the image-capturing chip 100, the image-capturing chip 100 can be made smaller.

Figure 2:
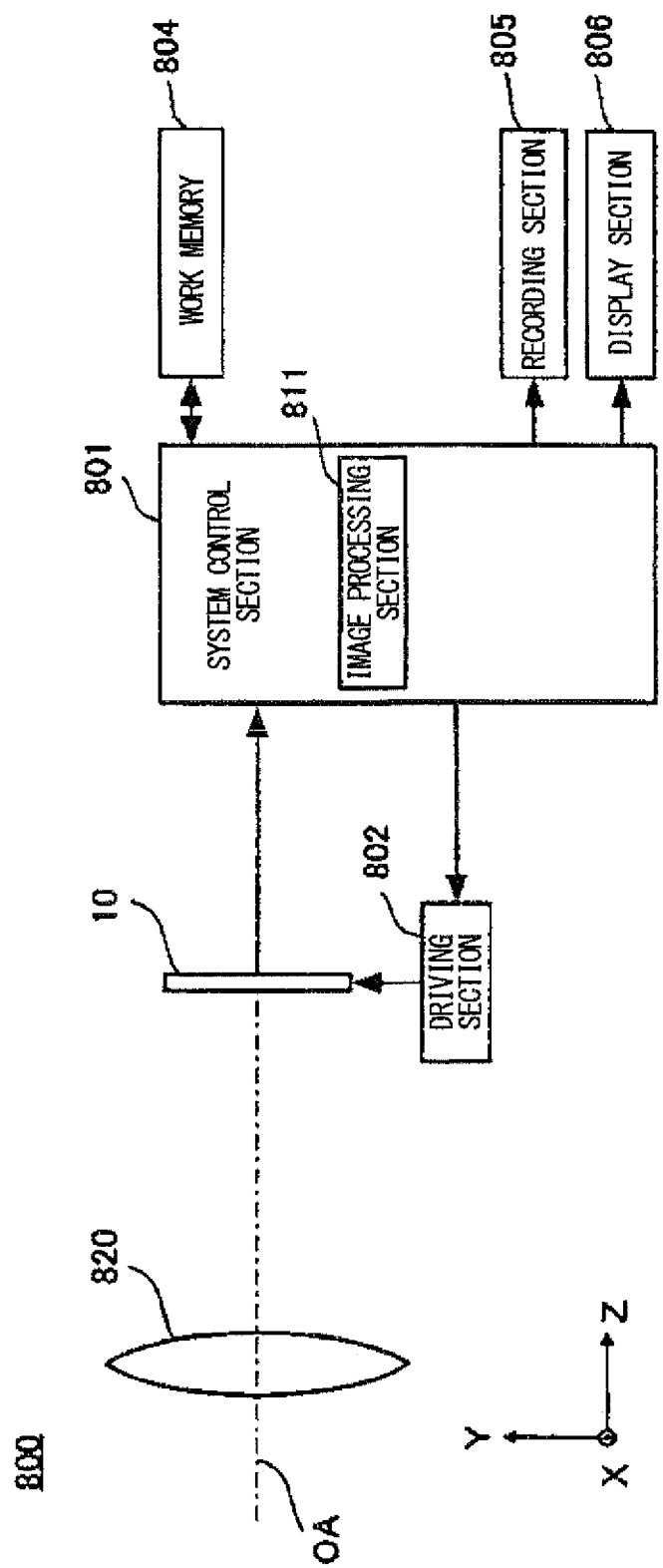
FIG. 2 is a block diagram showing a configuration of an image-capturing apparatus according to an embodiment of the present invention.

FIG. 2 is a block diagram showing a configuration of an image-capturing apparatus according to an embodiment of the present invention. The image-capturing apparatus 800 includes an image-capturing lens 820 that serves as an image capturing optical system, and the image-capturing lens 820 guides subject light that is incident thereto along the optical axis OA to the image-capturing unit 10. The image-capturing lens 820 may be an exchangeable lens that can be attached to and removed from the image-capturing apparatus 800. The image-capturing apparatus 800 primarily includes the image-capturing unit 10, a system control section 801, a driving section 802, a work memory 804, a recording section 805, and a display section 806.

The image-capturing lens 820 is formed by a plurality of optical lens groups, and focuses the subject light from a scene at a region near a focal plane. FIG. 2 represents the image-capturing lens 820 as a single virtual lens arranged near the pupil. The driving section 802 is a control circuit that performs dynamic control of the image-capturing unit 10, region control, charge accumulation control, and the like, according to instructions from the system control section 801.

The image-capturing unit 10 passes the pixel signal to the image processing section 811 of the system control section 801. The image processing section 811 performs various types of image processing, with the work memory 804 as a work space, to generate the image data. For example, when generating image data with a JPEG file format, the image processing section 811 performs white balance processing, gamma processing, or the like and then performs a compression process. The generated image data is recorded in the recording section 805 and also converted into a display signal and displayed in the display section 806.

Figure 3A:
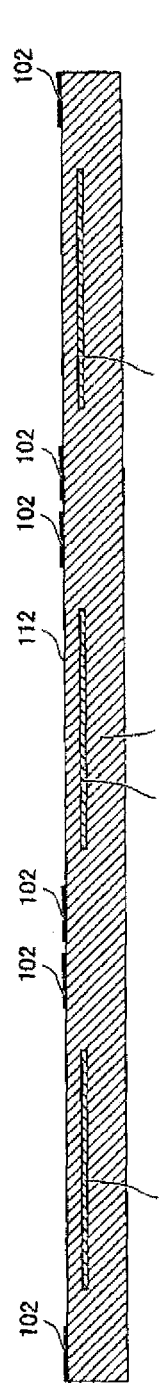
FIGS. 3A to 3E are views for describing the image-capturing unit manufacturing method.

FIGS. 3A to 3E are views for describing the image-capturing unit 10 manufacturing method. Specifically, FIGS. 3A to 3E show steps of processing at the wafer level. First, as shown in FIG. 3A, the wafer 110, on which is formed a plurality of pixel regions 101 that each include a plurality of pixels for photoelectrically converting incident light, is prepared and the output terminal 102, which is electrically connected to the pixel region 101 and used for outputting the pixel signal that is the output of the pixels, is formed on the second surface 112 of the wafer 110 (terminal formation step).

Figure 3B:
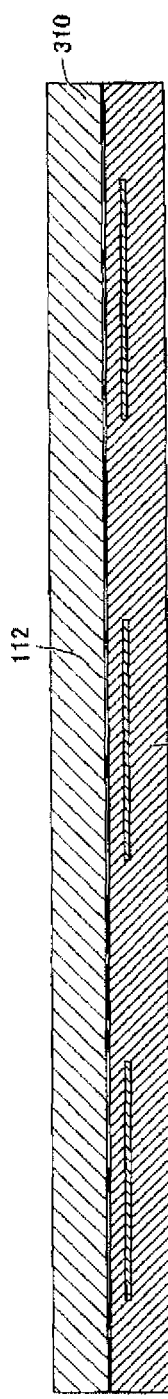

Next, as shown in FIG. 3B, the mounting substrate 310 is arranged facing the second surface 112 (mounting substrate arrangement step). In this way, the output terminal 102 is in a state of being sandwiched between the wafer 110 and the mounting substrate 310.

Figure 3C:
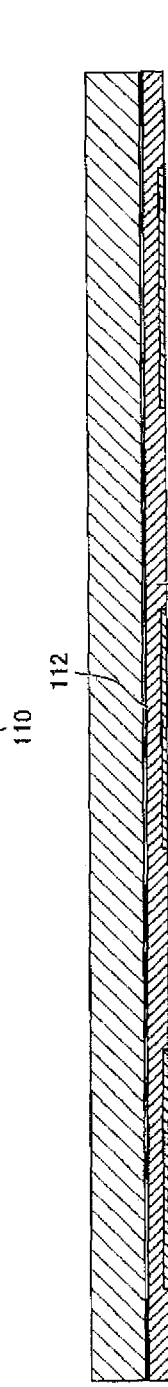

Next, as shown in FIG. 3C, grinding is performed on the surface of the wafer that is on an opposite side of the second surface 112, and the first surface 111 is formed to input the incident light to the pixels (grinding step). By performing this grinding, the thickness of the wafer 120 after grinding is less than that of the wafer 110 before grinding. The grinding method can be CMP (Chemical Mechanical Polishing) or BG (Back Grinding).

Figure 3D:
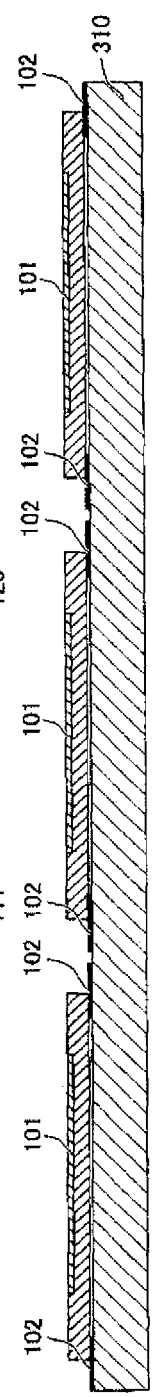

Next, as shown in FIG. 3D, in a state where the mounting substrate 310 side is arranged at the bottom of the drawing, partial etching is performed on the regions between adjacent pixel regions 101 on the wafer. As a result, the output terminal 102 formed on the second surface 112 is exposed.

Figure 3E:
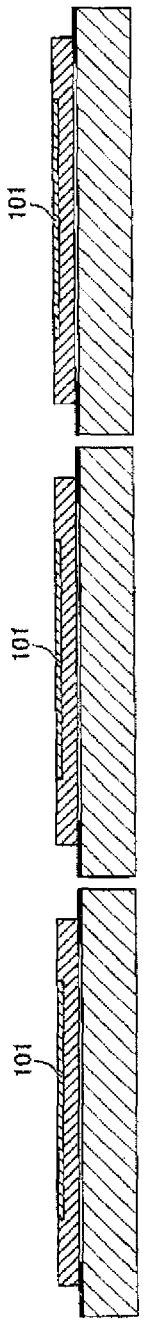

Next, the wafer and the mounting substrate are cut into separate circuit regions that each include a pixel region 101. In this way, as shown in FIG. 3E, individual pieces are formed by separating the wafer into chip units (separation process).

Figure 4A:
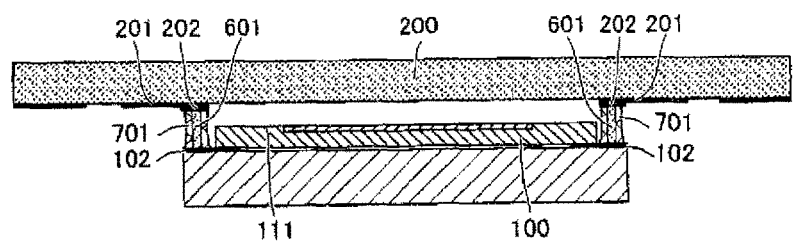
FIGS. 4A to 4C are views for describing the image-capturing unit manufacturing method.
Figure 4B:
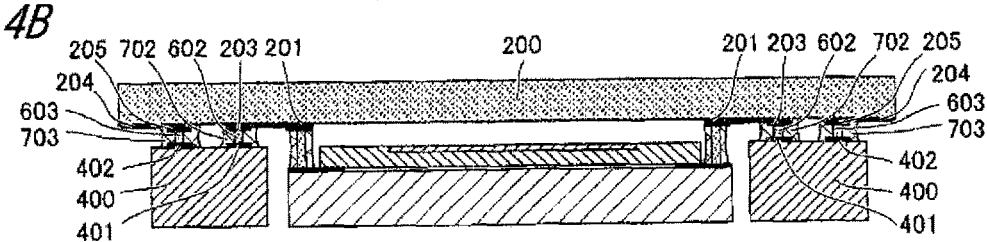
Figure 4C:
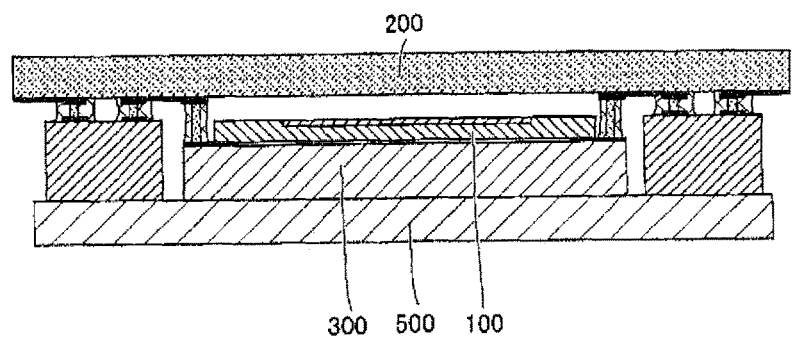

FIGS. 4A to 4C are views for describing the image-capturing unit 10 manufacturing method. Specifically, FIGS. 4A to 4C show steps performed after the separation. The steps after the separation process are applied in the same manner to each image-capturing chip, and therefore this description focuses on a single image-capturing chip.

As shown in FIG. 4A, the transparent substrate 200, which has the first wire pattern 201 arranged thereon in the peripheral region that is outside of the region corresponding to the pixels, is arranged to face the first surface 111 of the image-capturing chip 100 and cover the pixels, and the first wire pattern 201 and the output terminal 102 are connected (transparent substrate arrangement step). Specifically the adhesive agent 701 is formed on the output terminal 102 of the image-capturing chip 100 using a dispenser. A heat-curable resin can be used as the adhesive agent 701. The image-capturing chip 100 on which the adhesive agent 701 is formed is aligned with the transparent substrate 200 on which the first bump 601 has been formed in advance on the electrode pad 202 of the first wire pattern 201, and then the transparent substrate 200 is affixed on the image-capturing chip 100. The affixing of the image-capturing chip 100 and the transparent substrate 200 is performed in a heated state.

Next, as shown in FIG. 4B, the signal processing chip 400 including the processing circuit that processes the pixel signal is arranged on the transparent substrate 200 and connected to the first wire pattern 201 and the second wire pattern 204 (signal processing chip arrangement step). Specifically, the adhesive agent 702 is formed on the electrode pad 401 of the signal processing chip 400 using a dispenser. In the same manner, the adhesive agent 703 is formed on the electrode pad 402 of the signal processing chip 400 using a dispenser. The signal processing chip 400 on which the adhesive agent 702 and the adhesive agent 703 are formed is aligned with the transparent substrate 200, on which the second bump 602 and the third bump 603 have been formed in advance respectively on the electrode pad 203 and the electrode pad 205, and then the transparent substrate 200 is affixed on the signal processing chip 400. The affixing of the signal processing chip 400 and the transparent substrate 200 is performed in the heated state.

Next, as shown in FIG. 4C, the heat releasing member 500 is arranged in a manner to contact the surface of the mounting substrate 300 on the opposite side of the image-capturing chip 100 side surface and the surface of the signal processing chip 400 on the opposite side of the transparent substrate 200 side surface.

With the image-capturing unit 10 manufacturing method of the present embodiment, the wafer is etched to expose the output terminal 102, and then the output terminal 102 and the electrode pad 202 are bump-bonded. Since there is no TSV requiring complicated processing formed on the image-capturing chip 100, the overall process can be simplified.

In the above description, the stress is reduced by including the mounting substrate 300 with a linear expansion coefficient between the linear expansion coefficients of the image-capturing chip 100 and the transparent substrate 200. Even if the mounting substrate 300 itself does not have a linear expansion coefficient between the linear expansion coefficients of the image-capturing chip 100 and the transparent substrate 200, a film having a linear expansion coefficient between the linear expansion coefficients of the image-capturing chip 100 and the transparent substrate 200 may be formed on the mounting substrate 300. By forming a film that as a characteristic of pulling in a direction opposite the direction in which the image-capturing chip 100 pulls, deformation of the image-capturing unit due to heating or cooling can be restricted. This film can be realized as a SiON-type film. This SiON-type film can be formed through CVD (Chemical Vapor Deposition). The characteristics of the film can be changed by changing the ratio of nitrogen and oxygen in the SiON-type film or by changing the formation conditions of this film, for example.

In the above description, one heat releasing member 500 contacts both the image-capturing chip 100 and the signal processing chip 400, but instead an independent heat releasing member 500 may be provided for each chip. In this way, the size of the heat releasing member 500 can be optimized according to the amount of heat generated by each chip. The amount of heat generated by the signal processing chip 400 is greater than the amount of heat generated by the image-capturing chip 100, and therefore the surface area of the heat releasing member arranged on the signal processing chip 400 is preferably greater than the surface area of the heat releasing member arranged on the image-capturing chip 100. For example, the heat releasing member arranged on the signal processing chip 400 may be formed with a fin shape.

Furthermore, a third wire pattern for relaying the pixel signal output from the output terminal 102 to the first wire pattern 201 may be formed on the front surface of the mounting substrate 300. In this case, the output terminal 102 need not extend outside the image-capturing chip 100. In other words the output terminal 102 is arranged on the non-incident surface of the image-capturing chip 100 and the third wire pattern is bump-bonded to the output terminal 102. The third wire pattern and the first wire pattern 201 are then connected by the first bump 601. The output terminal 102 and the first wire pattern 201 are connected via the first bump 601 and the third wire pattern. In other words the first bump 601 and the third wire pattern function as a relay section that relays the pixel signal output from the output terminal 102 to the first wire pattern 201. Furthermore, the output terminal 102 and the first wire pattern can be electrically connected through wire bonding.

Figure 5:
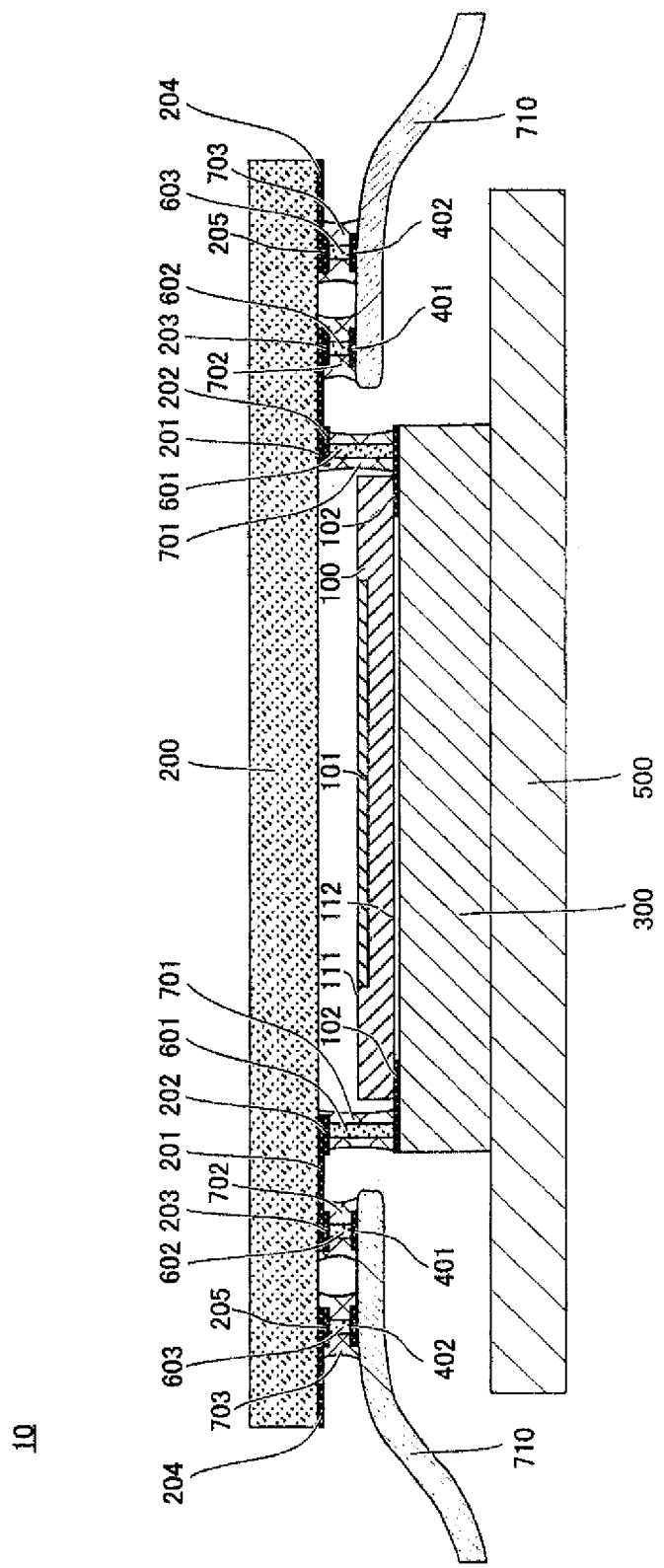
FIG. 5 shows another configuration of an image-capturing unit.

In the above description, the pixel region 101 and the processing circuit for processing the pixel signal are formed on separate chips, but may instead be formed on the same chip. FIG. 5 shows another configuration of an image-capturing unit 10. The image-capturing unit 10 shown in FIG. 5 includes an image-capturing chip 100, a transparent substrate 200, a mounting substrate 300, a heat releasing member 500, and a flexible substrate 710. The image-capturing chip 100 shown in FIG. 5 includes a pixel region 101 on the first surface 111 side. An output terminal 102, which is the output section for outputting the pixel signal read from the pixels, is arranged on a second surface 112, which is the surface facing away from the first surface 111. The output terminal 102 is arranged to extend outward at both ends of the second surface 112. The image-capturing chip 100 includes a column circuit that has an initial stage amplifier in a region outside of the pixel region 101. Furthermore, the image-capturing chip 100 includes a processing circuit for processing the pixel signal.

In the image-capturing unit 10 shown in FIG. 5 as well, the image-capturing chip 100 and the transparent substrate 200 are not directly bump-bonded to each other, and the mounting substrate 300 having a linear expansion coefficient between the linear expansion coefficients of the image-capturing chip 100 and the transparent substrate 200 is interposed between the image-capturing chip 100 and the transparent substrate 200. By interposing the mounting substrate 300 between the image-capturing chip 100 and the transparent substrate 200, the difference between the linear expansion coefficients of the transparent substrate 200 and the mounting substrate 300 can be made small relative to the difference between the linear expansion coefficients of the image-capturing chip 100 and the transparent substrate 200. Accordingly, the stress placed on the first bump 601 can be decreased.

In the image-capturing unit 10 shown in FIG. 5, the flexible substrate 710 includes an electrode pad 401 and an electrode pad 402. The electrode pad 401 is electrically connected to the electrode pad 203 of the first wire pattern 201, via the second bump 602. The connecting section between the electrode pad 401 and the electrode pad 203 is attached by the adhesive agent 702 formed to surround this connecting section. The electrode pad 402 is electrically connected to the electrode pad 205 of the second wire pattern 204, via the third bump 603. The connecting section between the electrode pad 402 and the electrode pad 205 is attached by the adhesive agent 703 formed to surround this connecting section. With the image-capturing unit 10 shown in FIG. 5, the pixel signal of the pixel region is output to the output terminal 102 from the non-incident surface side of the image-capturing chip 100, and then processed by the processing circuit in the image-capturing chip 100. After this, the pixel signal is transmitted to the incident surface side by the first bump 601, and then transmitted to the outside through the transparent substrate 200 and the flexible substrate 710.

In the above description, the output terminal 102 is formed on the second surface 112 side of the image-capturing chip 100, but may instead be formed on the first surface 111 side.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

Even if the process flow is described using phrases such as "first" or "next" in the claims, embodiments, or diagrams, it does not necessarily mean that the process must be performed in this order.

What is claimed is:

1. An image-capturing unit comprising:
   a substrate to which light is inputted;
   a film on which an image-capturing chip to which light from the substrate is inputted is arranged; and
   a connecting section that connects the substrate and the film, wherein the image-capturing chip, the substrate and the film have different thermal expansion coefficients, and
   a difference between the thermal expansion coefficients of the film and the substrate is smaller than a difference between the thermal expansion coefficients of the image-capturing chip and the substrate.

2. The image-capturing unit according to claim 1, wherein the substrate has a wiring, and
   the connecting section electrically connects the image-capturing chip and the wiring.

3. The image-capturing unit according to claim 2, wherein the image-capturing chip includes:
   a pixel that includes a photoelectric conversion section that converts light from the substrate into charge; and
   an output section that outputs a signal from the pixel.

4. The image-capturing unit according to claim 3, wherein the image-capturing chip includes a first surface facing the substrate and a second surface facing the film,
   a plurality of the pixels are arranged on the first surface, and
   the output section is arranged on the second surface.

5. The image-capturing unit according to claim 2, wherein the connecting section includes a bump that electrically connects the image-capturing chip and the wiring.

6. The image-capturing unit according to claim 3, further comprising a signal processing chip that is connected to the wiring and processes a signal outputted from the pixel.

7. The image-capturing unit according to claim 6, wherein the signal processing chip is arranged in parallel with the image-capturing chip.

8. The image-capturing unit according to claim 1, further comprising a heat conducting agent that conducts heat from the image-capturing chip.

9. The image-capturing unit according to claim 1, further comprising a heat releasing member that conducts heat from the image-capturing chip.

10. The image-capturing unit according to claim 1, further comprising a sealing member that seals a space between the image-capturing chip and the substrate.

11. An image-capturing apparatus comprising the image-capturing unit according to claim 1.

* * * * *